(12) United States Patent
Kim et al.

(10) Patent No.: US 10,901,275 B2
(45) Date of Patent: Jan. 26, 2021

(54) DISPLAY DEVICE

(71) Applicant: SAMSUNG DISPLAY CO., LTD., Yongin-si (KR)

(72) Inventors: Yeon-Sung Kim, Suwon-si (KR); Hyoung-Wook Kim, Hwaseong-si (KR); Okyi Lee, Andong-si (KR); Hyun-Seok Jeong, Suwon-si (KR); Jinho Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 53 days.

(21) Appl. No.: 16/191,890

(22) Filed: Nov. 15, 2018

(65) Prior Publication Data

US 2019/0182948 A1    Jun. 13, 2019

(30) Foreign Application Priority Data

Dec. 12, 2017    (KR) .......................... 10-2017-0170518

(51) Int. Cl.
*G02F 1/1345*    (2006.01)
*G02F 1/1362*    (2006.01)
(Continued)

(52) U.S. Cl.
CPC .... *G02F 1/13452* (2013.01); *G02F 1/136286* (2013.01); *G02F 1/1368* (2013.01); (Continued)

(58) Field of Classification Search
CPC ............. G02F 1/1368; G02F 1/136286; G02F 1/13452
See application file for complete search history.

(56) References Cited

U.S. PATENT DOCUMENTS 9,280,947 B2 * 3/2016 Kim ...................... G09G 5/003
9,564,091 B2    2/2017 Kim
2007/0002243 A1    1/2007 Kim

FOREIGN PATENT DOCUMENTS

KR    10-2003-0074038    9/2003
KR    10-2004-0107742    12/2004
(Continued)

OTHER PUBLICATIONS

Korean Office Action (in Korean) issued in corresponding application No. 10-2017-0170518 dated Aug. 16, 2018 (9 pages).

*Primary Examiner* — Dung T Nguyen
(74) *Attorney, Agent, or Firm* — F. Chau & Associates, LLC

(57) ABSTRACT

A display device includes a display substrate having a fan-out area, and a plurality of driving integrated circuits are arranged to reduce a signal delay variation. A printed circuit board (PCB) is connected to the fan-out area, and a driving integrated circuit (IC) is disposed on the PCB in a second direction. A first circuit board wiring is disposed on the PCB and connected to the driving IC. A second circuit board wiring is disposed in the second direction and connected to the driving IC. A first fan-out wiring is disposed on the fan-out area and connected to the first circuit board wiring, and a second fan-out wiring is disposed in the second direction from the fan-out area and connected to the second circuit board wiring. A sum of the length of the wiring of the first circuit board and the second circuit board may be substantially the same.

16 Claims, 7 Drawing Sheets

(51) Int. Cl.
  *H05K 1/02*       (2006.01)
  *H05K 1/18*       (2006.01)
  *H05K 1/14*       (2006.01)
  *H01L 27/12*      (2006.01)
  *H01L 25/18*      (2006.01)
  *G02F 1/1368*     (2006.01)
  *H05K 1/11*       (2006.01)

(52) U.S. Cl.
  CPC ............ *H01L 25/18* (2013.01); *H01L 27/124* (2013.01); *H05K 1/0216* (2013.01); *H05K 1/11* (2013.01); *H05K 1/142* (2013.01); *H05K 1/181* (2013.01); *H05K 2201/049* (2013.01); *H05K 2201/0784* (2013.01); *H05K 2201/09227* (2013.01); *H05K 2201/09272* (2013.01); *H05K 2201/10128* (2013.01); *H05K 2201/10136* (2013.01)

(56) References Cited

FOREIGN PATENT DOCUMENTS

| | | |
|---|---|---|
| KR | 10-2007-0002278 | 1/2007 |
| KR | 10-2008-0022359 | 3/2008 |
| KR | 10-2014-0102023 | 8/2014 |

\* cited by examiner

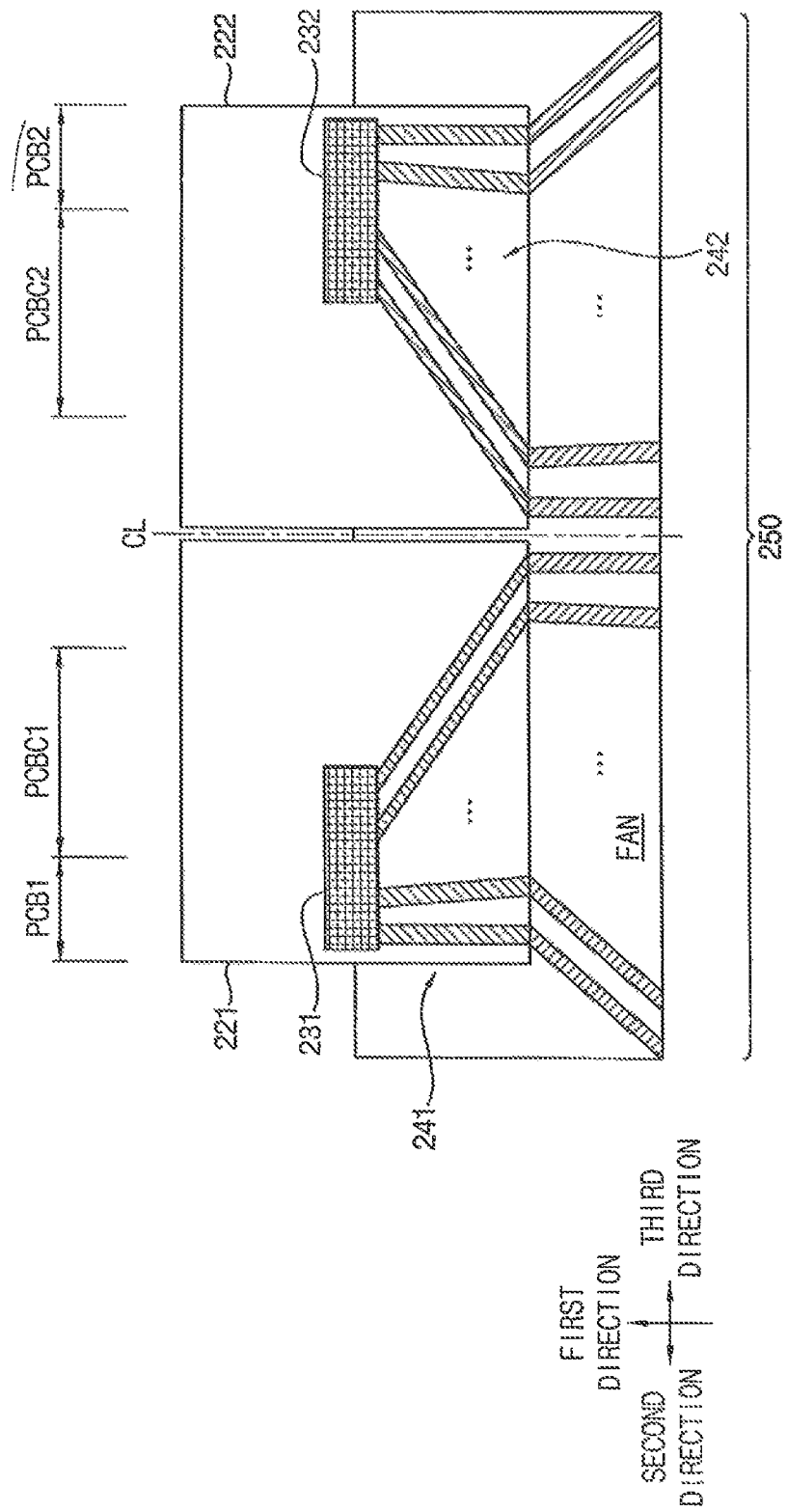

DISPLAY DEVICE

CROSS-REFERENCE TO RELATED APPLICATION(S)

This application claims priority under 35 USC § 119 from Korean Patent Application No. 10-2017-0170518, filed on Dec. 12, 2017 in the Korean Intellectual Property Office (KIPO), the entire disclosure of which is incorporated by reference herein.

1. TECHNICAL FIELD

Embodiments of the inventive concept relate to a display device and the wiring of a driving integrated circuit. More particularly, embodiments of the inventive concept relate to a display device including a printed circuit board on which the driving integrated circuit is disposed.

2. DISCUSSION OF THE RELATED ART

There are a number of different display device technologies that are being applied to modern electronic devices. For example, display devices may be categorized as being one of, a liquid crystal display (LCD) device, an organic light emitting diode (OLED) display device, a plasma display panel (PDP) display device, or an electrophoretic display (EPD) device, etc.

A display device may include gate lines, data lines, and pixels connected thereto, which are disposed in a display area. An image may be displayed in the display area by the pixels. In addition, the display device may further include a driving integrated circuit disposed in a non-display area located outside of the display area, and there may be fan-out wirings connecting the driving integrated circuit to the gate lines or the data lines.

As the size of a display device increases, and as the number of the fan-out wirings connected to a single driving integrated circuit increases, a variation of length (and thus, a variation of resistance) between the fan-out wirings may increase. As a result, a signal delay (e.g., an RC delay) variation may occur between the fan-out wirings, resulting in degradation of display quality.

To enhance the degradation of display quality, methods for equalizing signal delay variation according to length differences between the fan-out wirings such as controlling widths of the fan-out wirings or forming the fan-out wirings in a zigzag shape have been suggested. However, a width of the non-display area in which the fan-out wirings are disposed has been decreased recently because of consumer preferences to construct display devices with a relatively narrow bezel, Therefore, attempts to equalize the signal delay variation based on the aforementioned change of structure of the fan-out wirings may be limited.

SUMMARY

Embodiments of the inventive concept provide a display device that reduces the signal delay variation according to resistance differences between fan-out wirings and is constructed with a narrow bezel.

In view of the above, a display device according to an embodiment of the inventive concept may include a display substrate including a display area and a fan-out area located in a first direction from the display area; a printed circuit board connected to a center portion of the fan-out area of the display substrate; a driving integrated circuit disposed on the printed circuit board in a second direction crossing the first direction from a center portion of the printed circuit board; a first circuit board wiring disposed on the center portion of the printed circuit board, the first circuit board wiring being connected to the driving integrated circuit; a second circuit board wiring disposed in the second direction from the center portion of the printed circuit board, the second circuit board wiring being connected to the driving integrated circuit; a first fan-out wiring disposed on the center portion of the fan-out area, the first fan-out wiring being connected to the first circuit board wiring; and a second fan-out wiring disposed in the second direction from the center portion of the fan-out area, the second fan-out wiring being connected to the second circuit board wiring. A length of the first circuit board wiring may be greater than a length of the second circuit board wiring. A length of the first fan-out wiring may be less than a length of the second fan-out wiring.

In an embodiment of the inventive concept, the length of the first circuit board wiring may be longer than the length of the second circuit board wiring to compensate for a signal delay that occurs when a length of the first fan-out wiring is less than a length of the second fan out wiring.

In an embodiment of the inventive concept, a sum of the length of the first circuit board wiring and the length of the first fan-out wiring may be substantially equal to a sum of the length of the second circuit board wiring and the length of the second fan-out wiring.

In an embodiment of the inventive concept, the first circuit board wiring may extend in a diagonal direction with respect to the first direction, and the second circuit board wiring may extend in parallel with the first direction.

In an embodiment of the inventive concept, a non-display area of the display substrate includes the fan-out area, and a first plurality of printed circuit boards are arranged along a first side of the non-display area and a second plurality of printed circuit boards are arranged along a second side of the non-display area, wherein each of the first plurality of printed circuit boards and each of the plurality of second printed circuit boards having at least one respective driving integrated circuit.

In an embodiment of the inventive concept, the at least one respective driving integrated circuit on each one of the plurality of first printed circuit boards comprises a data driving integrated circuit, and the at least one respective driving integrated circuit on each one of the plurality of second printed circuit boards comprises a gate driving integrated circuit.

In an embodiment of the inventive concept, the first fan-out wiring may extend in parallel with the first direction, and the second fan-out wiring may extend in a diagonal direction with respect to the first direction.

In an embodiment of the inventive concept, the second circuit board wiring may have a straight line shape.

In an embodiment of the inventive concept, the first circuit board wiring may have a straight line shape.

In an embodiment of the inventive concept, the first circuit board wiring may have a shape in which a line is bent at least once.

According to an embodiment of the inventive concept, a display device may include a display substrate including a display area and a fan-out area located in a first direction from the display area; a printed circuit board connected to a center portion of the fan-out area of the display substrate; a first driving integrated circuit and a second driving integrated circuit respectively disposed on the printed circuit board in a second direction and a third direction, which oppose each other and cross the first direction, from a center portion of the printed circuit board; a plurality of circuit board wirings disposed on the printed circuit board, the plurality of circuit board wirings being connected to the first driving integrated circuit or the second driving integrated circuit; and a plurality of fan-out wirings disposed on the fan-out area, the plurality of fan-out wirings being respectively connected to the plurality of circuit board wirings. Lengths of the plurality of circuit board wirings decrease along the second direction or the third direction from the center portion of the printed circuit board. Lengths of the plurality of fan-out wirings increase along the second direction or the third direction from the center portion of the fan-out area.

In an embodiment of the inventive concept, the sums of the plurality of the circuit board wirings and the plurality of the fan-out wirings connected to each other may be substantially equal.

In an embodiment of the inventive concept, the lengths of the plurality of circuit board wirings may uniformly decrease along the second direction or the third direction from the center portion of the printed circuit board. Lengths of the plurality of fan-out wirings may uniformly increase along the second direction or the third direction from the center portion of the fan-out area.

In an embodiment of the inventive concept, the first driving integrated circuit may be adjacent to a side of the printed circuit board located in the second direction from the center portion thereof. The second driving integrated circuit may be adjacent to another side of the printed circuit board located in the third direction from the center portion thereof.

In an embodiment of the inventive concept, a number of circuit board wirings connected to the first driving integrated circuit and a number of circuit board wirings connected to the second driving integrated circuit among the plurality of the circuit board wirings may be substantially equal.

In an embodiment of the inventive concept, the plurality of circuit board wirings and the plurality of fan-out wirings may have a straight line shape.

In an embodiment of the inventive concept, the plurality of circuit board wirings may have included angles greater than 0 degrees and less than 90 degrees with respect to the first direction. The included angles may decrease along the second direction or the third direction from the center portion of the printed circuit board.

In an embodiment of the inventive concept, the plurality of fan-out wirings may have included angles greater than 0 degrees and less than 90 degrees with respect to the first direction. The included angles may increase along the second direction or the third direction from the center portion of the fan-out area.

In an embodiment of the inventive concept, the display device may further include a plurality of gate wirings or a plurality of data wirings disposed in the display area and extending along the first direction. The plurality of gate wirings or the plurality of data wirings may be respectively connected to the plurality of fan-out wirings.

Embodiments of the inventive concept provide a display device that may include a display substrate including a display area and a fan-out area located in a first direction from the display area; a first printed circuit board and a second printed circuit board respectively disposed on the printed circuit board in a second direction and a third direction, which oppose each other and cross the first direction, from a center portion of the fan-out area; a first driving integrated circuit disposed on the first printed circuit board in the second direction from a center portion of the first printed circuit board; a second driving integrated circuit disposed on the second printed circuit board in the third direction from a center portion of the second printed circuit board; a plurality of first circuit board wirings disposed on the first printed circuit board, the plurality of first circuit board wirings being connected to the first driving integrated circuit; a plurality of second circuit board wirings disposed on the second printed circuit board, the plurality of second circuit board wirings being connected to the second driving integrated circuit; and a plurality of fan-out wirings disposed on the fan-out area, the plurality of fan-out wirings being respectively connected to the plurality of first circuit board wirings and the plurality of second circuit board wirings. Lengths of the plurality of first circuit board wirings may decrease along the second direction. Lengths of the plurality of second circuit board wirings may decrease along the third direction. Lengths of the plurality of fan-out wirings may increase along the second direction or the third direction from the center portion of the fan-out area.

In an embodiment of the inventive concept, sums of lengths of the plurality of first circuit board wirings and lengths of the plurality of fan-out wirings connected to each other are substantially equal to sums of lengths of the plurality of second circuit board wirings and lengths of the plurality of fan-out wirings connected to each other to compensate for a signal delay variation of the plurality of fan-out wirings.

In an embodiment of the inventive concept, the first driving integrated circuit may be adjacent to a side of the first printed circuit board opposite to another side thereof adjacent to the second printed circuit board. The second driving integrated circuit may be adjacent to a side of the second printed circuit board opposite to another side thereof adjacent to the first printed circuit board.

In an embodiment of the inventive concept, the first driving integrated circuit and the plurality of first circuit board wirings may be symmetrically disposed to the second driving integrated circuit and the plurality of second circuit board wirings, respectively, with respect to a virtual center line crossing between the first printed circuit board and the second printed circuit board.

In the display device according to the embodiments of the inventive concept, the driving integrated circuit may be disposed on a left side and a right side of the printed circuit board, and lengths of the circuit board wirings connected to the driving integrated circuit decrease along a direction from a center to the left side or the right side. Accordingly, a narrow bezel may be realized, and a signal delay variation according to resistance differences between the fan-out wirings may decrease.

BRIEF DESCRIPTION OF THE DRAWINGS

A person of ordinary skill in the art will better-appreciate the embodiments of the inventive concept from the following detailed description taken in conjunction with the accompanying drawings.

FIG. 7 is a plan view illustrating an example of an enlarged region D in FIG. 6.

DETAILED DESCRIPTION OF THE EMBODIMENTS

Hereinafter, display devices in accordance with embodiments of the inventive concept will be explained in detail with reference to the accompanying drawings.

Figure 1:
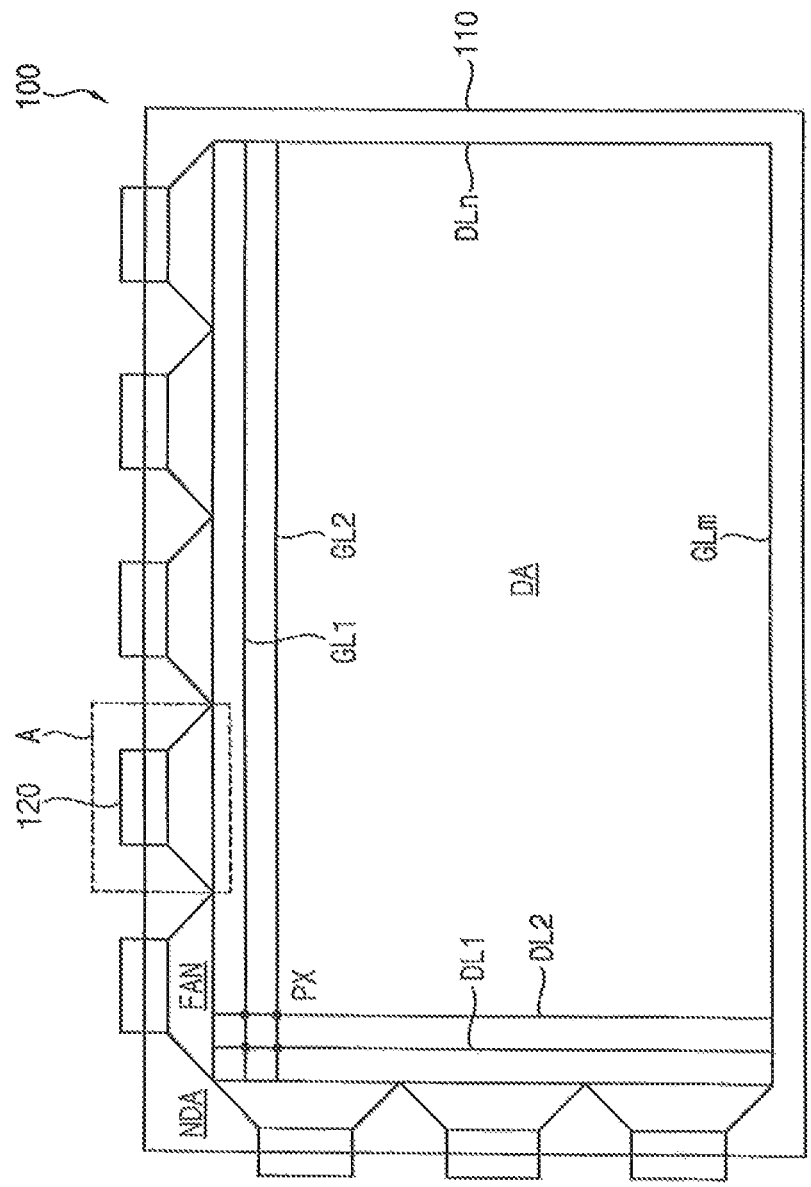
FIG. 1 is a plan view illustrating a display device according to an embodiment of the inventive concept.

FIG. 1 is a plan view illustrating a display device according to an embodiment of the inventive concept.

Referring to FIG. 1, a display device 100 according to an embodiment of the inventive concept may include a display substrate 110 and a printed circuit board 120. The display substrate 110 may include a display area DA in which an image is displayed and a non-display area NDA disposed outside the display area DA. In an embodiment, the non-display area may be arranged along a periphery, or a portion of a periphery of the display area. The printed circuit board 120 may be connected to the non-display area NDA of the display substrate 110.

The display device 100 may include an opposing substrate (not shown) that opposes the display substrate 110, and a liquid crystal layer (not shown) disposed between the display substrate 110 and the opposing substrate. For convenience of description, the opposite substrate and the liquid crystal layer are omitted in FIG. 1.

A plurality of pixels PX, a plurality of gate lines GL1~GLm, and a plurality of data lines DL1~DLn may be disposed on the display substrate 110. The pixels PX may be arranged in the display area DA in a matrix form. The gate lines GL1~GLm may apply gate signals to the respective pixels PX. The data lines DL1~DLn may apply data voltages to the respective pixels PX. Although on the display substrate 110 according to an embodiment of the inventive concept as shown in FIG. 1 described herein the pixels PX are arranged in an m×n matrix form, it should be understood by a person of ordinary skill in the art that the embodiments of the inventive concept are not limited to the structure shown in FIG. 1.

Each of the pixels PX may include a thin-film transistor and a pixel electrode connected to the thin film transistor. Each thin film transistor may include a gate electrode extending from the gate lines GL1~GLm, a source electrode extending from the data lines DL1~DLn, and a drain electrode connected to the pixel electrode.

The non-display area NDA may include a fan-out area FAN, and the printed circuit board 120 may be connected to an end of the fan-out area FAN. The printed circuit board 120 may be connected to the display area DA through the fan-out area FAN.

A driving integrated circuit may be disposed on the printed circuit board 120. In addition, the driving integrated circuit may be a gate driving integrated circuit electrically connected to the gate lines GL1~GLm, or a data driving integrated circuit electrically connected to the data lines DL1~DLn.

If the driving integrated circuit is a gate driving integrated circuit, in response to an externally input control signal the gate driving integrated circuit may sequentially turn on or turn off the thin film transistors provided in the pixels PX. The gate driving integrated circuit may include a plurality of shift registers. The shift registers may sequentially apply gate signals generated in response to the externally input control signal to the pixels PX through the gate lines GL1~GLm.

If the driving integrated circuit is a data driving integrated circuit, there may be a selection of reference data voltages for displaying an image in response to the externally input control signal in synchronization with the gate driving integrated circuit, and the data driving may apply the selected reference voltages to the pixels PX through the data lines DL1~DLn. In an embodiment, the data driving integrated circuit may be connected to a reference-voltage generating element that generates and applies the reference voltages.

Although the display device 100 shown in FIG. 1 according to an embodiment of the inventive concept is described as including three printed circuit boards 120 on which the gate driving integrated circuit is disposed and five printed circuit boards 120 on which the data driving integrated circuit is disposed, the embodiments of the inventive concept are not limited thereto. For example, the display device 100 according to an embodiment may include various number of printed circuit boards 120 that a larger number of printed circuit boards 120 or a smaller number of printed circuit boards than shown and described herein above.

Figure 2:
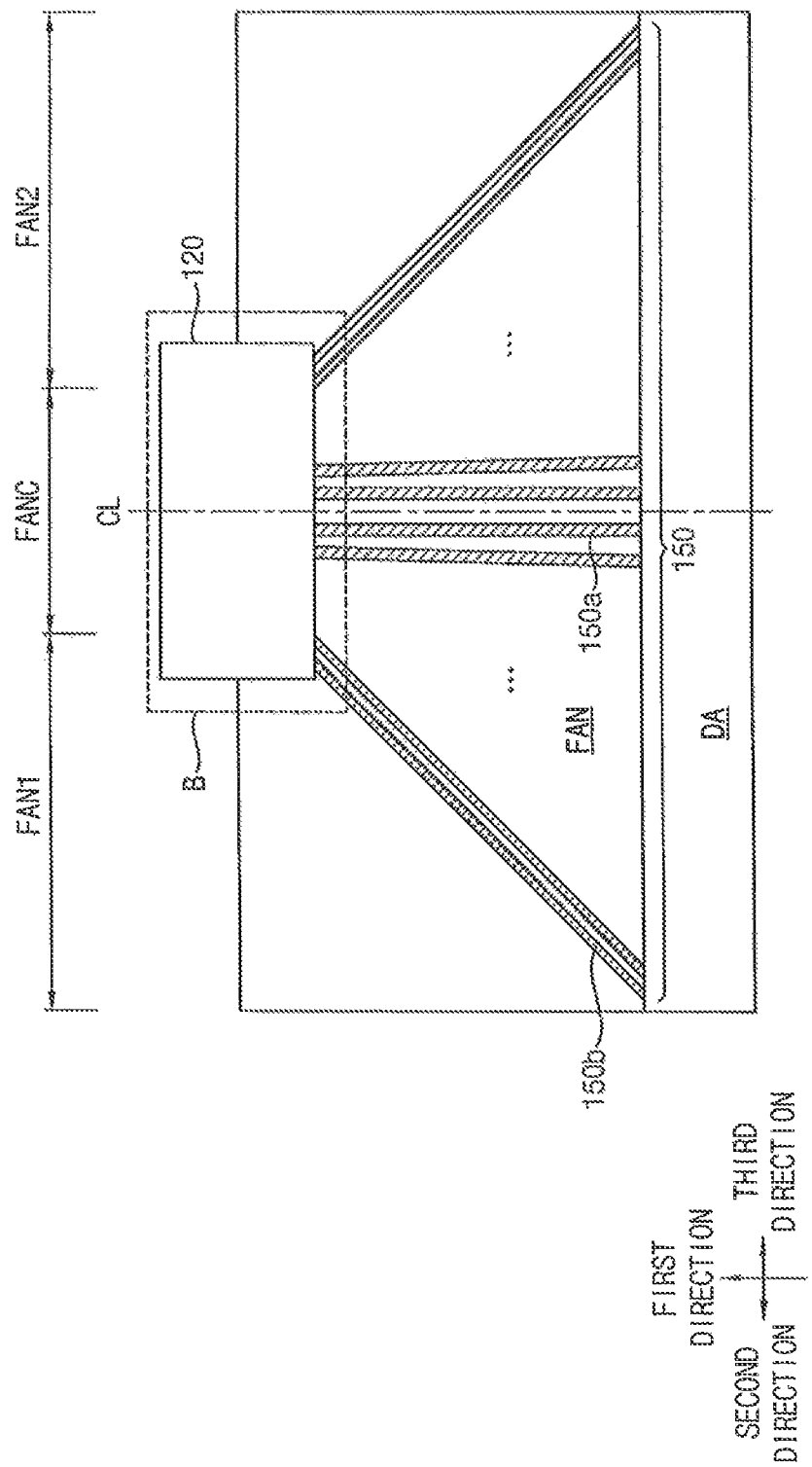
FIG. 2 is a plan view illustrating an enlarged region A in FIG. 1.

FIG. 2 is a plan view illustrating an enlarged region A of FIG. 1. It is to be understood by a person of ordinary skill in the art that according to an embodiment, the structure including the single fan-out area FAN and the single printed circuit board 120 connected thereto illustrated in FIG. 2 may be applied to the other fan-out areas FAN and the other printed circuit boards 120.

Referring to FIGS. 1 and 2, the fan-out area FAN may be located in a first direction from the display area DA. The fan-out area FAN may include a center portion FANC, a first side portion FAN1, and a second side portion FAN2. The first side portion FAN1 and the second side portion FAN2 may be respectively located in a second direction and a third direction, which oppose each other and cross the first direction, from the center portion FANC.

The printed circuit board 120 may be connected to the center portion FANC of the fan-out area FAN. The printed circuit board 120 may contact an end of the center portion FANC of the fan-out area FAN.

A plurality of fan-out wirings 150 may be disposed in the fan-out area FAN. The fan-out wirings 150 may be respectively connected to the gate lines GL1~GLm or the data lines DL1~DLn. Accordingly, the fan-out wirings 150 may apply the gate signal from the gate driving integrated circuit to the gate lines GL1~GLm or may apply the reference voltage from the data driving integrated circuit to the data lines DL1~DLn.

The fan-out wirings 150 may extend from the integrated circuit board 120 disposed on the center portion FANC of the fan-out area FAN to the gate lines GL1~GLm or the data lines DL1~DLn disposed in the display area DA corresponding to the center portion FANC, the first side portion FAN1, and the second side portion FAN2 of the fan-out area FAN. Accordingly, lengths of the fan-out wirings 150 may increase along the second direction or the third direction from the center portion FANC of the fan-out area FAN. For example, a length of a first fan-out wiring 150a disposed on the center portion FANC of the fan-out area FAN may be less than a length of a second fan-out wiring 150b disposed in the second direction from the center portion FNC of the fan-out area FAN. Here, the first fan-out wiring 150a may be a fan-out wiring 150 mostly adjacent to a virtual center line CL crossing a center of the fan-out area FAN and extending along the first direction, and the second fan-out wiring 150*b* may be a fan-out wiring 150 located furthermost in the second direction or the third direction from the first fan-out wiring 150*a*. In this case, a signal delay variation may occur according to length (or resistance) differences between the fan-out wirings 150.

Hereinafter, structures for compensating the signal delay variation according to the length (or resistance) differences between the fan-out wirings 150 will be described with reference to FIG. 3.

Figure 3:
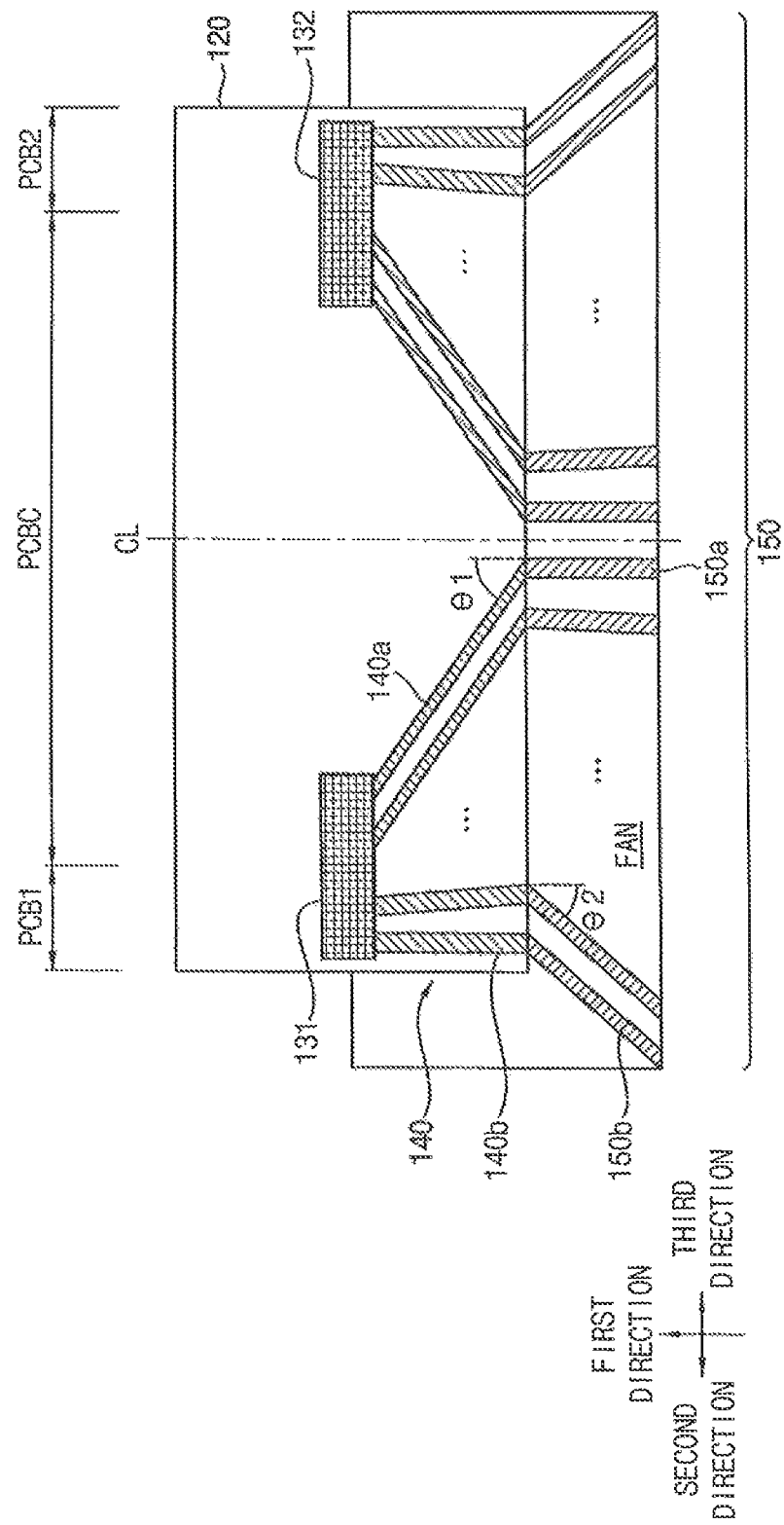
FIG. 3 is a plan view illustrating an example of an enlarged region B in FIG. 2.

FIG. 3 is a plan view illustrating an example of an enlarged region B in FIG. 2.

Referring to FIGS. 2 and 3, a first driving integrated circuit 131, a second driving integrated circuit 132, and a plurality of circuit board wirings 140 may be disposed on the printed circuit board 120.

The first driving integrated circuit 131 and the second driving integrated circuit 32 may be disposed on the printed circuit board 120. The first driving integrated circuit 131 and the second driving integrated circuit 132 may be respectively disposed on the printed circuit board in the second direction and the third direction from a center portion PCBC of the printed circuit board 120. In other words, the printed circuit board 120 may include the center portion PCBC, and a first side portion PCB1 and a second side portion PCB2 respectively located in the second direction and the third direction from the center portion PCBC, and the first driving integrated circuit 131 and the second driving integrated circuit 132 may be respectively disposed on the first side portion PCB1 and the second side portion PCB2 of the printed circuit board 120.

In an embodiment of the inventive concept, the first driving integrated circuit 131 may be adjacent to a first side (e.g., a left side of the printed circuit board 120) located in the second direction from the center portion PCBC of the printed circuit board 120, and the second driving integrated circuit 132 may be adjacent to a second side (e.g., a right side of the printed circuit board) located in the third direction from the center portion PCBC of the printed circuit board 120. A person of skill in the art should understand and appreciate that the sides as described are examples and may be reversed.

With continued reference to FIG. 3, the circuit board wirings 140 may be connected to the first driving integrated circuit 131 or the second driving integrated circuit 132. The circuit board wirings 140 may respectively connect the first driving integrated circuit 131 or the second driving integrated circuit 132 to the fan-out wirings 150.

Lengths of the circuit board wirings 140 may decrease along the second direction or the third direction from the center portion PCBC of the printed circuit board 120. For example, a length of a first circuit board wiring 140*a* disposed on the center portion PCBC of the printed circuit board 120 may be greater than a length of a second circuit board wiring 140*b* disposed in the second direction from the center portion PCBC of the printed circuit board 120. Here, the first circuit board wiring 140*a* may be a circuit board wiring 140 mostly adjacent to the center line CL, and the second circuit board wiring 140*b* may be a circuit board wiring 140 located furthermost in the second direction or the third direction from the first circuit board wiring 140*a*. In this case, the first circuit board wiring 140*a* may be connected to the first fan-out wiring 150*a* and the second circuit board wiring 140*b* may be connected to the second fan-out wiring 150*b*.

In an embodiment of the inventive concept, the sums of lengths of the circuit board wirings 140 and lengths of the fan-out wirings 150 connected to each other may be substantially equal. For example, a sum of a length of the first circuit board wiring 140*a* and a length of the first fan-out wiring 150*a* may be substantially equal to a sum of a length of the second circuit board wiring 140*b* and a length of the second fan-out wiring 150*b*. Accordingly, a signal delay variation according to length (or resistance) differences between the fan-out wirings 150 may be compensated.

In addition, in an embodiment of the inventive concept, a substantially equal length may be less than a 1% difference in length. In another embodiment, a substantially equal length may be less than a 5% difference in length. In still another embodiment, substantially equal may be less than a 10% difference in length.

In an embodiment of the inventive concept, the lengths of the circuit board wirings 140 may substantially uniformly decrease along the second direction or the third direction from the center portion PCBC of the printed circuit board 120, and lengths of the fan-out wirings 150 may substantially uniformly increase along the second direction or the third direction from the center portion FANC of the fan-out area FAN. In other words, differences between lengths of neighboring circuit board wirings 140 may be substantially uniform, and differences between lengths of neighboring fan-out wirings 150 may be substantially uniform.

In an embodiment of the inventive concept, a number of the circuit board wirings 140 connected to the first driving integrated circuit 131 and a number of the circuit board wirings 140 connected to the second driving integrated circuit 132 among the circuit board wirings 140 may be substantially equal. For example, when a number of the fan-out wirings 150 on single fan-out area FAN is 960, 960 circuit board wirings 140 may be disposed on the printed circuit board 120 since the fan-out wirings 150 and the circuit board wirings 140 are corresponded in one-to-one. A number of the circuit board wirings 140 connected to the first driving integrated circuit 131 and a number of the circuit board wirings 140 connected to the second driving integrated circuit 132 may be 480, respectively. Thus, in both circuit boards there may be, for example, 960 circuit board wirings.

In an embodiment of the inventive concept, the circuit board wirings 140 and the fan-out wirings 150 may have a straight line shape. For example, all of the first circuit board wiring 140*a*, the second circuit board wiring 140*b*, the first fan-out wiring 150*a*, and the second fan-out wiring 150*b* may have a straight line shape. In a conventional display device, to decrease the difference in length (or resistance) between the fan-out wirings, the fan-out wirings located on the center portion of the fan-out area may have a zigzag shape, and a width of the fan-out area along the first direction may be increased by the shape of the fan-out wirings. However, according to an embodiment of the inventive concept, the fan-out wirings 150 may have a straight line shape, and compensation of the signal delay variation may be achieved by decreasing length (or resistance) differences between the fan-out wirings 150 based on a disposition of the first driving integrated circuit 131 and second driving integrated circuit 132, and lengths of the circuit board wirings 140.

In an embodiment of the inventive concept, the circuit board wirings 140 may have included angles $\Theta 1$ greater than or substantially equal to 0 degrees and less than 90 degrees (preferably, less than 45 degrees), and the included angles $\Theta 1$ may decrease along the second direction or the third direction from the center portion PCBC of the printed circuit board 120. For example, the first circuit board wiring 140a may extend in a diagonal direction with respect to the first direction, and the second circuit board wiring 140b may extend in parallel with the first direction.

In an embodiment of the inventive concept, the fan-out wirings 150 may have included angles $\ominus 2$ greater than or substantially equal to 0 degrees and less than 90 degrees (preferably, less than 45 degrees), and the included angles $\ominus 2$ may increase along the second direction or the third direction from the center portion FANC of the fan-out area FAN. For example, the first fan-out wiring 150a may extend in parallel with the first direction, and the second fan-out wiring 150b may extend in a diagonal direction with respect to the first direction. In an embodiment of the inventive concept, the first fan-out wiring 150a may extend substantially in parallel with the first direction. For example, with reference to FIG. 3, while some of the first fan-out wiring 150a extends in parallel with the first direction, some of the first fan-out wiring may be, for example less than two degrees from the first direction, and thus a person of ordinary skill in the art should understand and appreciate that this difference may be considered to be substantially parallel.

Figure 4:
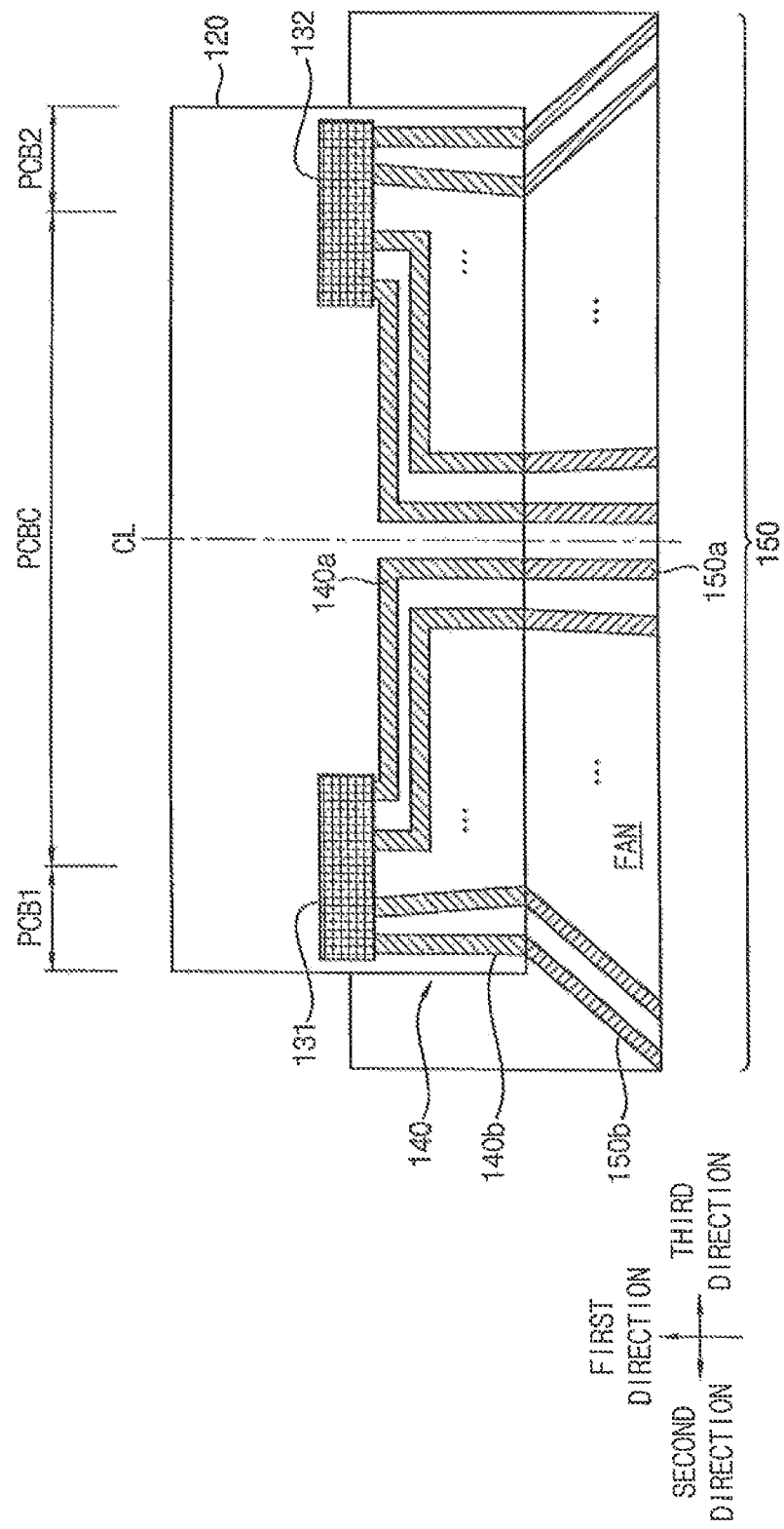
FIG. 4 is a plan view illustrating another example of an enlarged region B in FIG. 2.

FIG. 4 is a plan view illustrating another example of an enlarged region B in FIG. 2. In another example with reference to FIG. 4, shapes of some of the circuit board wirings 140 may be different from those of an example with reference to FIG. 3.

Referring now to FIG. 4, in an embodiment of the inventive concept, the circuit board wirings 140 disposed on the center portion PCBC of the printed circuit board 120 may have a shape in which a line is bent at least once, and the circuit board wirings 140 located in the second direction or the third direction from the center portion PCBC of the printed circuit board 120 and the fan-out wirings 150 may have a straight line shape. For example, the first circuit board wiring 140a may have a shape in which a line is bent at least once, and all of the second circuit board wiring 140b, the first fan-out wiring 150a, and the second fan-out wiring 150b may have a straight line shape.

When the fan-out wirings 150 are longer than the circuit board wirings 140, and all of the circuit board wirings 140 have a straight shape, the circuit board wirings 140 disposed on the center portion PCBC of the printed circuit board 120 may not provide a sufficient compensation of signal delay variation. However, in an embodiment of the inventive concept, the circuit board wirings 140 disposed on the center portion PCBC of the printed circuit board 120 may have a shape in which a line is bent at least once, so that the signal delay variation may be sufficiently compensated, as the bent line may have a longer length.

Figure 5:
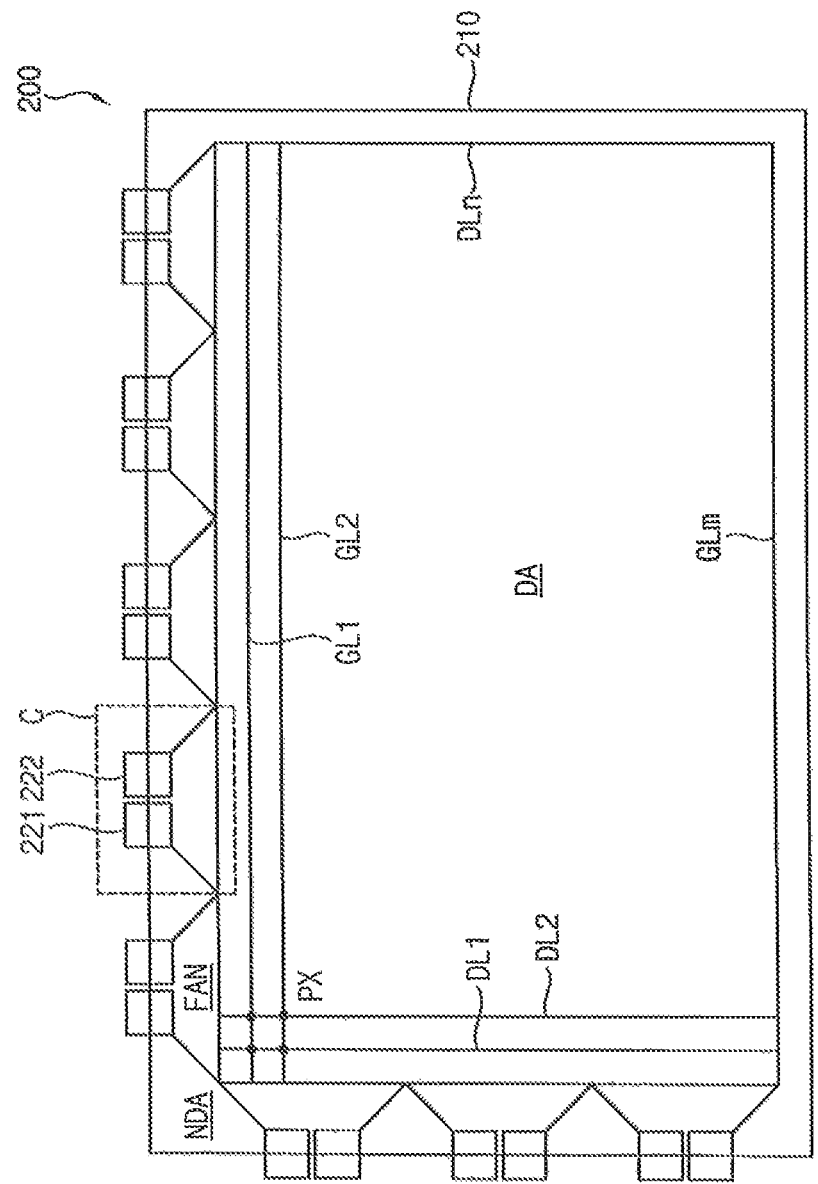
FIG. 5 is a plan view illustrating a display device according to an embodiment of the inventive concept.
Figure 6:
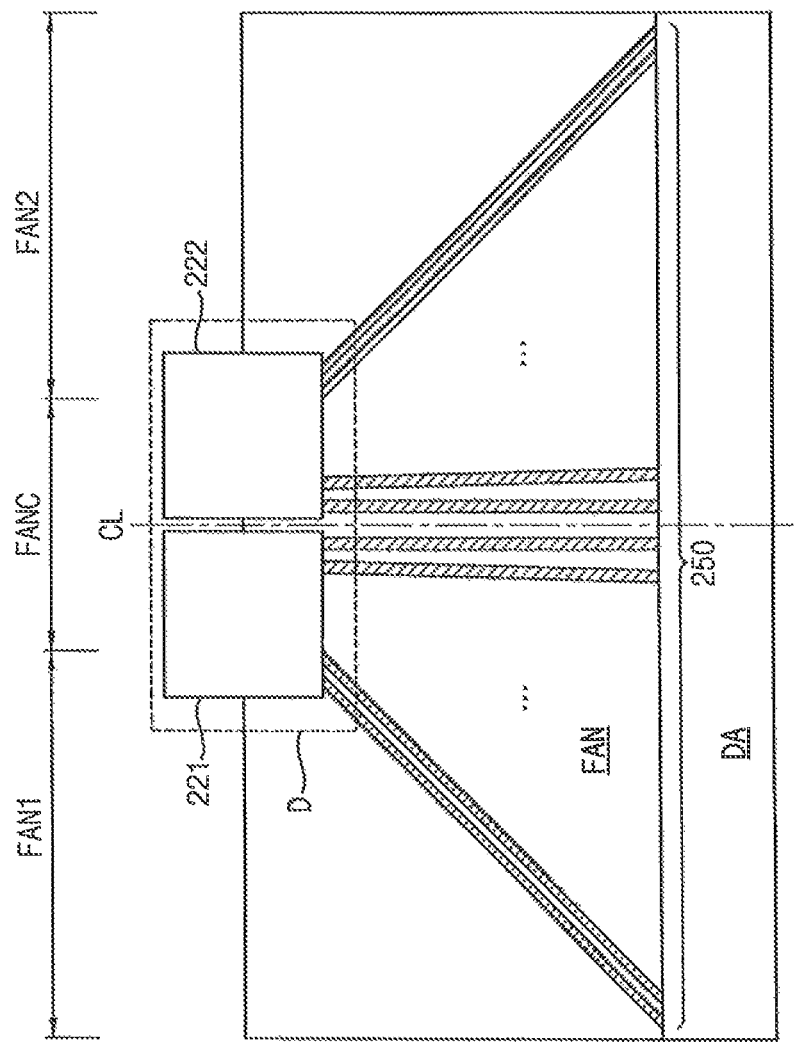
FIG. 6 is a plan view illustrating an enlarged region C in FIG. 5.

FIG. 5 is a plan view illustrating a display device according to an embodiment of the inventive concept. FIG. 6 is a plan view illustrating an enlarged region C in FIG. 5. FIG. 7 is a plan view illustrating an example of an enlarged region D in FIG. 6.

Descriptions of elements of the display device 200 are now provided according to an embodiment with reference to FIGS. 5, 6, and 7. Elements in this embodiment, which are substantially the same as, or similar to those elements discussed with reference to FIGS. 1, 2, and 3, will not be repeated.

Referring to FIG. 5, a display device 200 according to an embodiment of the inventive concept may include a display substrate 210, a first printed circuit board 221, and a second printed circuit board 222. The display substrate 210 may include a display area DA in which an image is displayed and a non-display area NDA disposed outside the display area DA. The first printed circuit board 221 and the second printed circuit board 222 may be connected to the non-display area NDA of the display substrate 210. There may be a plurality of pairs of the first printed circuit board 221 and the second printed circuit board 222. While in this embodiment the pairs of the first printed circuit board 221 and the second printed circuit board 222 are arranged along two sides of the non-display area NDA, a person of ordinary skill in the art understands and appreciates that other arrangements are within the scope of embodiments of the inventive concept.

The non-display area NDA may include the fan-out area FAN, and the first printed circuit board 221 and the second printed circuit board 222 may be connected to an end of the fan-out area FAN. The first printed circuit board 221 and the second printed circuit board 222 may be connected to the display area DA through the fan-out area FAN.

Referring now to FIG. 6, which is the enlarged area "C" of FIG. 5, the first printed circuit board 221 and the second printed circuit board 222 may be connected to the center portion FANC of the fan-out area FAN. The first printed circuit board 221 and the second printed circuit board 222 may be in contact with an end of the center portion FANC of the fan-out area FAN. The first printed circuit board 221 and the second printed circuit board 222 may be respectively disposed in the second direction and the third direction from the center portion FANC of the fan-out area FAN as shown.

Referring to FIG. 7, a first driving integrated circuit 231 and a plurality of first circuit board wirings 241 may be disposed on the first printed circuit board 221, and a second driving integrated circuit 232 and a plurality of second circuit board wirings 242 may be disposed on the second printed circuit board 222.

The first driving integrated circuit 231 may be disposed in the second direction from a center portion PCBC1 of the first printed circuit board 221, and the second driving integrated circuit 232 may be disposed in the third direction from a center portion PCBC2 of the second printed circuit board 222. In other words, the first printed circuit board 221 may include the center portion PCBC1 and a first side portion PCB1 located in the second direction from the center portion PCBC1, and the first driving integrated circuit 231 may be disposed on at least the first side portion PCB1. Further, the second printed circuit board 222 may include the center portion PCBC2 and a second side portion PCB2 located in the third direction from the center portion PCBC2, and the second driving integrated circuit 232 may be disposed on at least the second side portion PCB2. As can be seen in FIG. 7, each of the first driving integrated circuit 231 and the second driving integrated circuit 232 is also partially arranged in a respective center portion PCB1 and PCB2.

In an embodiment of the inventive concept, the first driving integrated circuit 231 may be adjacent to one side opposite to another side of the first printed circuit board 221 adjacent to the second printed circuit board 222, and the second driving integrated circuit 232 may be adjacent to one side opposite to another side of the second printed circuit board 222 adjacent to the first printed circuit board 221. For example, the one side and the another side of the first printed circuit board 221 may be a left side and a right side of the first printed circuit board 221, respectively, and the one side and the another side of the second printed circuit board 222 may be a right side and a left side of the second printed circuit board 222, respectively.

The first circuit board wirings 241 may be connected to the first driving integrated circuit 231, and the second circuit board wirings 242 may be connected to the second driving integrated circuit 232. The first circuit board wirings 241 may connect the first driving integrated circuit 231 to the respective fan-out wirings 250, and the second circuit board wirings 242 may connect the second driving integrated circuit 232 to the respective fan-out wirings 250.

The fan-out wirings 250 connected to first circuit board wirings 241 are arranged to one side of a center line CL between the first printed circuit board 221 and the second printed circuit board 222, and the fan-out wirings 250 connected to the second circuit board wirings 242 are arranged to another side of the center line CL. As also shown in FIG. 7, the fan-out wirings 250 may have a decreased angle as the wirings approached the area between center portions PCB1 and PCB2. A person of ordinary skill in the art should understand and appreciate that the embodiments of the inventive concept are not limited to the arrangement shown in FIG. 7.

In addition, the lengths of the first circuit board wirings 241 may decrease along the second direction, and lengths of the second circuit board wirings 242 may decrease along the third direction.

In an embodiment of the inventive concept, sums of lengths of the first circuit board wirings 241 and lengths of the fan-out wirings 250 connected to each other, and sums of lengths of the second circuit board wirings 242 and lengths of the fan-out wirings 250 connected to each other may be substantially equal. Accordingly, a signal delay variation according to length (or resistance) differences between the fan-out wirings 250 may be compensated.

In an embodiment of the inventive concept, lengths of the first circuit board wirings 241 may substantially uniformly decrease along the second direction, and lengths of the second circuit board wirings 242 may substantially uniformly decrease along the third direction. In other words, differences between lengths of neighboring first circuit board wirings 241 may be substantially uniform, and differences between lengths of neighboring second circuit board wirings 242 may be substantially uniform.

In an embodiment of the inventive concept, the first driving integrated circuit 231 and the first circuit board wirings 241 may be symmetrically disposed with the second driving integrated circuit 232 and the second circuit board wirings 242, respectively, with respect to a virtual center line CL crossing between the first printed circuit board 221 and the second printed circuit board 222. Accordingly, a number of the first circuit board wirings 241 may be equal to a number of the second circuit board wirings 242. For example, when a number of the fan-out wirings 250 on single fan-out area FAN is 960, a number of each of the first circuit board wirings 241 and a number of the second circuit board wirings 242 may be 480, respectively, because the fan-out wirings 250 and the first circuit board wirings 241 and the second circuit board wirings 242 correspond to each other one-to-one.

The display device according to the embodiments of the inventive concept may be applied to a display device included in a computer, a notebook, a mobile phone, a smartphone, a smart pad, a PMP, a PDA, an MP3 player, or the like.

Although the display devices according to the embodiments of the inventive concept have been described with reference to the drawings, the illustrated embodiments are examples, and may be modified and changed by a person having ordinary knowledge in the relevant technical field without departing from the technical spirit of the embodiments of the inventive concept and in the appended claims.

What is claimed is:

1. A display device, comprising:
    a display substrate including a display area and a fan-out area located in a first direction from the display area;
    a printed circuit board connected to a center portion of the fan-out area of the display substrate;
    a first driving integrated circuit and a second driving integrated circuit respectively disposed on the printed circuit board in a second direction and a third direction, which oppose each other and cross the first direction, from a center portion of the printed circuit board;
    a first circuit board wiring disposed on the center portion of the printed circuit board, the first circuit board wiring is connected to the first driving integrated circuit;
    a second circuit board wiring disposed in the second direction from the center portion of the printed circuit board, the second circuit board wiring is connected to the first driving integrated circuit;
    a first fan-out wiring disposed on the center portion of the fan-out area, the first fan-out wiring is connected to the first circuit board wiring; and
    a second fan-out wiring disposed in the second direction from the center portion of the fan-out area, the second fan-out wiring is connected to the second circuit board wiring,
    wherein a length of the first circuit board wiring is greater than a length of the second circuit board wiring, and
    wherein a length of the first fan-out wiring is less than a length of the second fan-out wiring.

2. The display device of claim 1, wherein a sum of the length of the first circuit board wiring and the length of the first fan-out wiring is substantially equal to a sum of the length of the second circuit board wiring and the length of the second fan-out wiring.

3. The display device of claim 1, wherein the first circuit board wiring extends in a diagonal direction with respect to the first direction, and
    wherein the second circuit board wiring extends substantially in parallel with the first direction.

4. The display device of claim 3, wherein the first fan-out wiring extends substantially in parallel with the first direction, and
    wherein the second fan-out wiring extends in a diagonal direction with respect to the first direction, and wherein the length of the first circuit board wiring is longer than the length of the second circuit board wiring to compensate for a signal delay based on the length of the first fan-out wiring being less than the length of the second fan-out wiring.

5. The display device of claim 1, wherein the first circuit board wiring and the second circuit board wiring have a straight line shape.

6. The display device of claim 1, wherein a non-display area of the display substrate includes the fan-out area, and the display device further comprises a first plurality of printed circuit boards arranged along a first side of the non-display area and a second plurality of printed circuit boards arranged along a second side of the non-display area, each of the first plurality of printed circuit boards and each of the plurality of second printed circuit boards having at least one respective driving integrated circuit.

7. The display device of claim 1, wherein the first circuit board wiring has a shape in which a line is bent at least once.

8. A display device, comprising:
a display substrate including a display area and a fan-out area located in a first direction from the display area;
a printed circuit board connected to a center portion of the fan-out area of the display substrate;
a first driving integrated circuit and a second driving integrated circuit respectively disposed on the printed circuit board in a second direction and a third direction, which oppose each other and cross the first direction, from a center portion of the printed circuit board;
a plurality of circuit board wirings disposed on the printed circuit board, the plurality of circuit board wirings being connected to the first driving integrated circuit or the second driving integrated circuit; and
a plurality of fan-out wirings disposed on the fan-out area, the plurality of fan-out wirings respectively connected to the plurality of circuit board wirings,
wherein lengths of the plurality of circuit board wirings decrease along the second direction or the third direction from the center portion of the printed circuit board, and
wherein lengths of the plurality of fan-out wirings increase along the second direction or the third direction from the center portion of the fan-out area.

9. The display device of claim 8, wherein sums of the lengths of the plurality of circuit board wirings and the lengths of the plurality of fan-out wirings connected to each other are substantially equal.

10. The display device of claim 8, wherein the lengths of the plurality of circuit board wirings uniformly decrease along the second direction or the third direction from the center portion of the printed circuit board, and
wherein the lengths of the plurality of fan-out wirings uniformly increase along the second direction or the third direction from the center portion of the fan-out area.

11. The display device of claim 8, wherein the first driving integrated circuit is adjacent to a first side of the printed circuit board located in the second direction from the center portion thereof, and
wherein the second driving integrated circuit is adjacent to a second side of the printed circuit board located in the third direction from the center portion thereof.

12. The display device of claim 8, wherein a number of circuit board wirings connected to the first driving integrated circuit and a number of circuit board wirings connected to the second driving integrated circuit among the plurality of circuit board wirings are substantially equal.

13. The display device of claim 8, wherein the plurality of circuit board wirings and the plurality of fan-out wirings have a straight line shape.

14. The display device of claim 13, wherein the plurality of circuit board wirings have included angles equal to or greater than 0 degrees and less than 90 degrees with respect to the first direction, and
wherein the included angles decrease along the second direction or the third direction from the center portion of the printed circuit board.

15. The display device of claim 14, wherein the plurality of fan-out wirings have included angles equal to or greater than 0 degrees and less than 90 degrees with respect to the first direction, and
wherein the included angles increase along the second direction or the third direction from the center portion of the fan-out area.

16. The display device of claim 8, further comprising: a plurality of gate wirings or a plurality of data wirings disposed in the display area and extending along the first direction,
wherein the plurality of gate wirings or the plurality of data wirings are respectively connected to the plurality of fan-out wirings.

* * * * *